United States Patent [19]

Haferstat

[11] Patent Number: 5,027,074

[45] Date of Patent: Jun. 25, 1991

[54] CABLE TESTER

[75] Inventor: Ernest C. Haferstat, Colorado Springs, Colo.

[73] Assignee: Premier Technologies, Denver, Colo.

[21] Appl. No.: 437,379

[22] Filed: Nov. 16, 1989

[51] Int. Cl.[5] ............................................. G01R 31/02
[52] U.S. Cl. ..................................... 324/539; 324/66; 379/26
[58] Field of Search ................... 324/66, 539, 540, 542, 324/541, 538; 379/26, 10, 12, 25

[56] References Cited

U.S. PATENT DOCUMENTS

| | | | |
|---|---|---|---|
| 3,217,244 | 11/1965 | Glover | 324/51 |
| 3,594,635 | 7/1971 | Minamii | 324/51 |
| 3,825,824 | 7/1974 | Herron | 324/51 |
| 3,891,811 | 6/1975 | Miller | 324/66 |
| 3,902,026 | 8/1975 | Rogers et al. | 324/66 X |
| 4,074,187 | 2/1978 | Miller et al. | 324/51 |
| 4,384,249 | 9/1980 | Medina | 324/51 |
| 4,418,312 | 11/1983 | Figler | 324/52 |
| 4,445,086 | 4/1984 | Bulatao | 324/66 |
| 4,620,282 | 10/1986 | Shelley | 324/66 |
| 4,748,402 | 5/1988 | Sellati | 324/66 |
| 4,814,693 | 3/1989 | Coben | 324/66 |
| 4,901,004 | 2/1990 | King | 324/66 |

Primary Examiner—Kenneth Wieder
Assistant Examiner—Robert W. Mueller
Attorney, Agent, or Firm—Stephen A. Gratton

[57] ABSTRACT

A cable tester for testing the individual conductors of a multiconductor cable. The cable tester includes a transmitter for connection to one end of the cable and a receiver for connection to the opposite end of the cable. The receiver includes a microprocessor having an EPROM memory. The receiver also includes an LCD display and a key pad for data input. In use the transmitter sequentially generates voltage pulses through each conductor of the cable and to the receiver. The receiver monitors these pulses at the opposite end of the cable and feeds this data into the microprocessor for processing and display on the LCD display. The cable tester quickly detects shots, opens, or crossed conductors within the cable and provides results of the testing on the LCD display.

20 Claims, 10 Drawing Sheets

CABLE TESTER

FIELD OF THE INVENTION

This invention relates to electrical testing apparatus and more particularly to a cable tester for testing and identifying conductors in a multiconductor cable.

DESCRIPTION OF RELATED ART

Multiconductor cables such as ribbon cables are frequently utilized in telephone equipment, computers and other electronic equipment. The cable ends are typically remote from one another and may terminate in socket or pin connectors for coupling the cable to various equipment. In general, for start up or repair of such cables each separate conductor must be identified and tested for continuity, shorts or crosses.

A variety of cable testers have heretofore been proposed in testing such multiconductor cables. Simple testers such as ohm meters and continuity testers are often utilized. Testing procedures with these testers involve a separate test of each conductor and thus can be slow and time consuming as well as error prone. Additionally, with these testers it is often difficult to simultaneously test the remote opposite ends of the cable which may be disposed in different rooms or buildings. Two operators at the opposite ends of the cable are often required to test the cable.

Other testers apply a voltage to one end of a selected conductor and if detected at the opposite end the voltage actuates a relay to successively apply the voltage to the next conductor. In general, testers of this nature require both ends of the cable to be brought together at a single location. This may not always be possible or practical.

Another type of tester such as disclosed in U.S. Pat. No. 4,445,086 to Bulatoa utilizes a transmitter which attaches at one end of the cable and a receiver which attaches at the opposite end. A sequencer at the transmitter end sequentially applies a test signal to each conductor separately. This signal is detected at the receiver end to identify continuity, shorts and opens, of the conductors. A problem with this type of cable tester is that a separate external conductor path such as over a ship's hull is required. For most applications however, it is difficult to find a separate conductor path external of the cable to be tested which terminates at the same physical location as the ends of the cable.

Additionally, with prior art cable testers the configurations of the receiver and the transmitter may not be adaptable to different cable sizes and end configurations and data on the test cable cannot be easily inputted into the tester. In addition, these testers are typically difficult to use and the output data may not be presented quickly in a format that is simple and easy to record.

Accordingly, it is an object of this invention to provide a cable tester for multiconductor cable that quickly tests a cable at its remote ends without the requirement of a separate external conductor path. Additionally, the cable tester of the present invention is adaptable to cables of varying end configurations. Moreover, data on the cable to be tested can be easily inputted into the cable tester and results are quickly outputted in an understandable format.

SUMMARY OF THE INVENTION

In accordance with the present invention, there is provided an improved tester for testing the individual conductors of a multi conductor cable. The cable tester generally stated comprises a transmitter for connection to one end of the cable and a receiver for connection to the opposite end of the cable. The receiver includes a microprocessor with an EPROM memory for processing input signals into the receiver and output signals to a LCD display, a key pad for inputting data into the microprocessor, and the LCD display for displaying data from the microprocessor.

The transmitter and receiver of the cable tester are each separately powered by battery or by an external DC power adapter. During the testing of a cable, the transmitter and receiver are connected to one another only by the cable under test. The transmitter is connected to one end of the cable using a cable adapter. The receiver is likewise connected to one end of the cable using a cable adapter.

In use, the transmitter sequentially generates voltage pulses on each conductor wire of the cable. The receiver then monitors the opposite end of the cable and displays the conductor wire location where pulses were found. Because the transmitter and receiver are independently powered and there is no external connection between them, other lines in the cable are used as a return path to complete the circuit loop. A minimum of three separate conductors on the test cable are required.

Continuity is detected when a pulse generated by the transmitter is detected on a corresponding conductor in the receiver. Opens exist when a transmitter pulse does not get detected by the receiver. Shorts between conductors in the cable are detected when two conductors indicate a voltage pulse at the same time.

In an illustrative embodiment of the invention, up to 64 separate conductors can be tested. The microprocessor monitors the input into the receiver and the results are displayed on the LCD display. Programs imprinted on the EPROM memory provide a microcode for operating the microprocessor. The key pad allows the operator to input data on the cable to be tested and scroll the display so that all connections found and those not found are shown on the display.

DESCRIPTION OF THE PREFERRED EMBODIMENT

Figure 1:
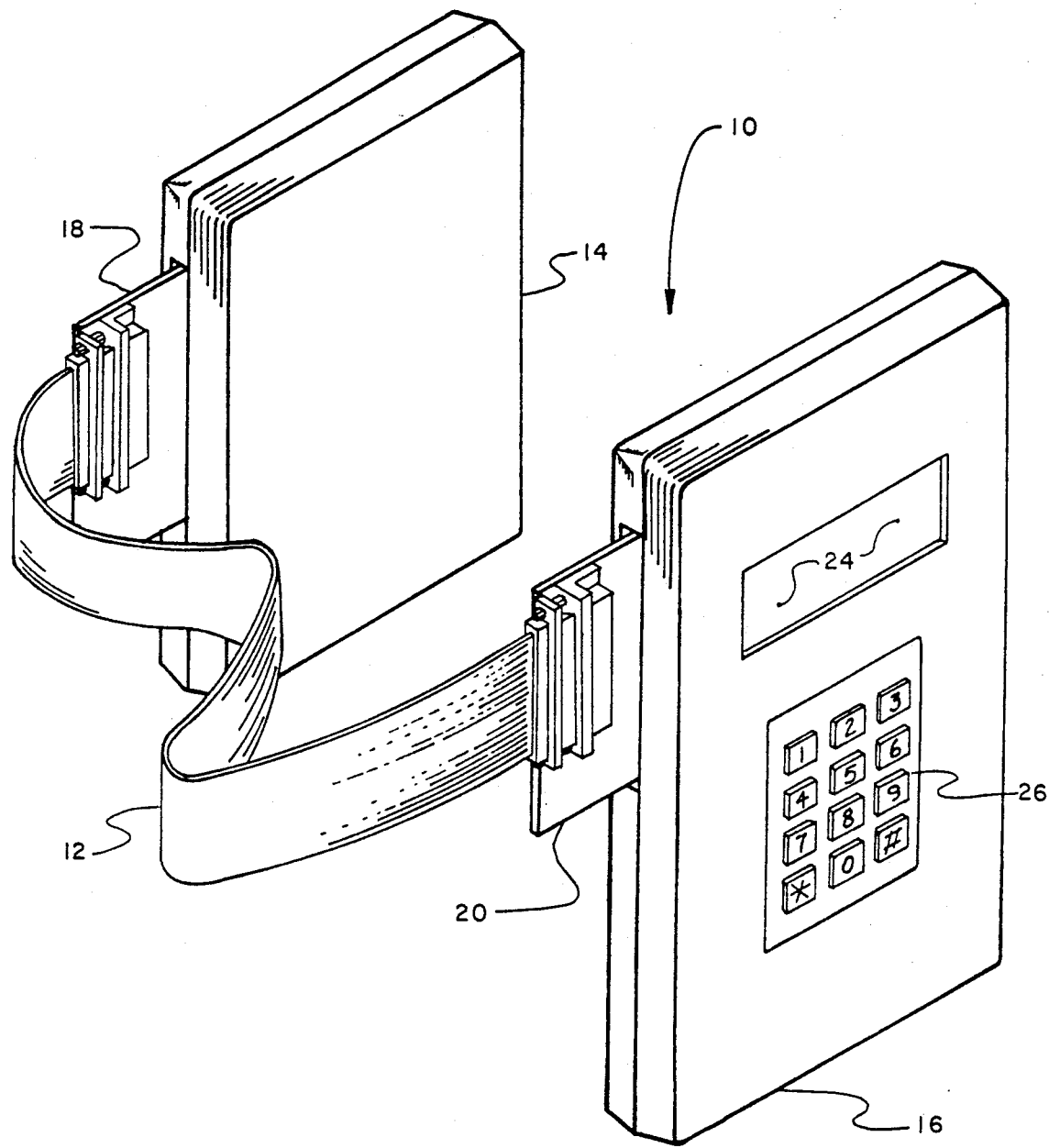
FIG. 1 is a perspective view of a cable tester constructed in accordance with the invention shown connected to a multi conductor ribbon cable.

Referring now to FIG. 1, a cable tester constructed in accordance with the invention is shown and generally designated as 10. The cable tester 10 is shown connected to a multiconductor cable 12. In the illustrative embodiment of the invention, the cable tester 10 is suited for testing cables having up to sixty-four separate conductors. Alternately, a cable tester may be constructed in accordance with the invention to test a multiconductor cable having any number of conductors greater than three. The operation of the cable tester requires a minimum of three separate conductors on the cable to be tested.

Figure 4:
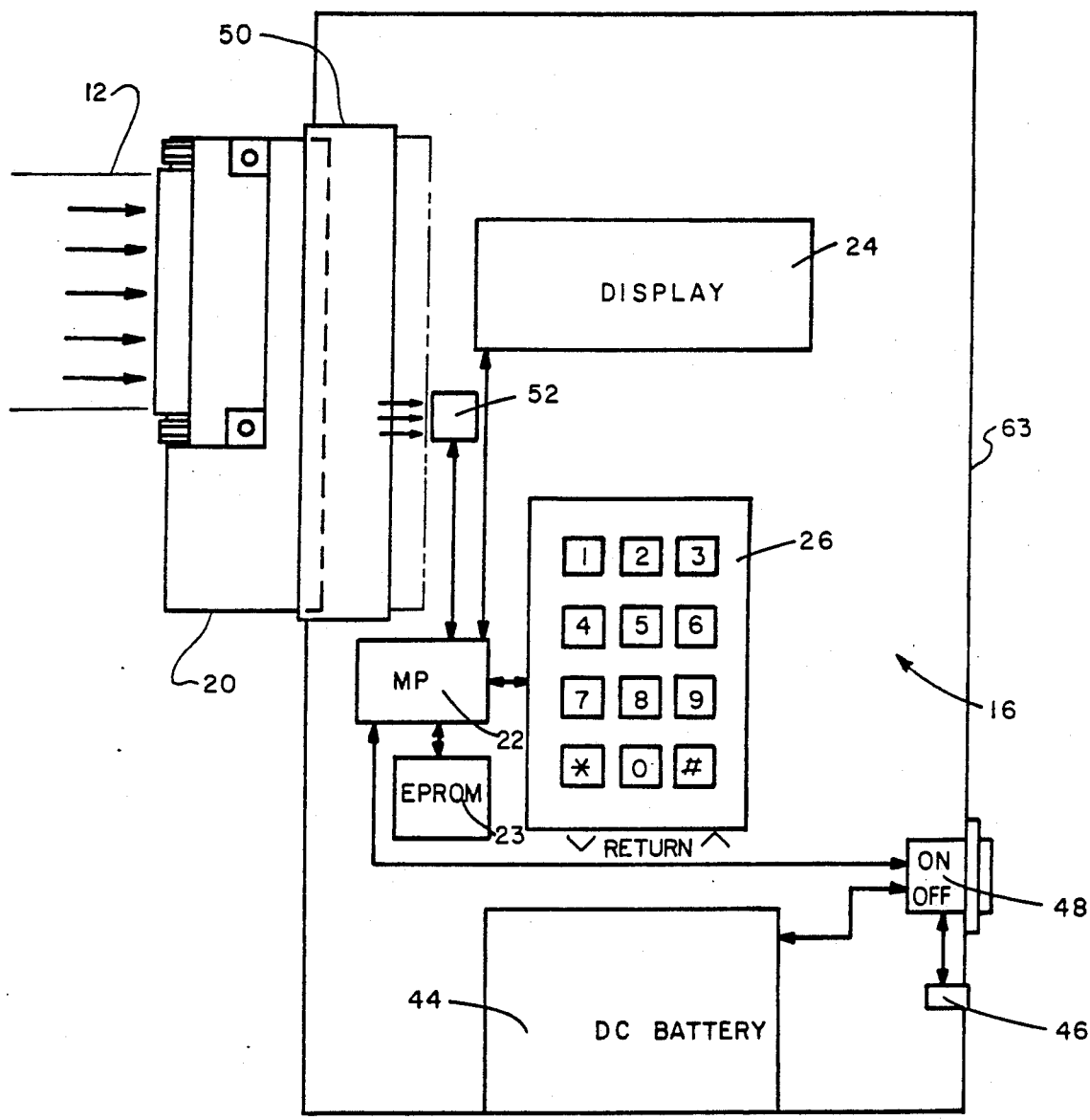
FIG. 4 is a schematic drawing of a receiver component of the cable tester.

The cable tester in general comprises a transmitter 14 and a receiver 16. The cable tester 10 also includes an adapter 18 for connecting the transmitter 14 to one end of the cable 12 and an adapter 20 for connecting the receiver 16 to the opposite end of the cable 12. As shown in FIG. 4, the receiver 16 further includes a microprocessor 22 having an EPROM memory 23, an LCD display 24 and a twelve character key pad 26.

In general, the transmitter 14 of the cable tester 10 includes electrical circuit means for sequentially generating an electrical signal through each conductor of the cable 12. The receiver 16 includes electrical circuit means for receiving the electrical signals from the transmitter 14 which are for input into the microprocessor 22. Electrical circuit means of the receiver further controls commands from the microprocessor 22 to the LCD display 24 and input of data from the key pad 26 into the microprocessor 22.

Figure 5:
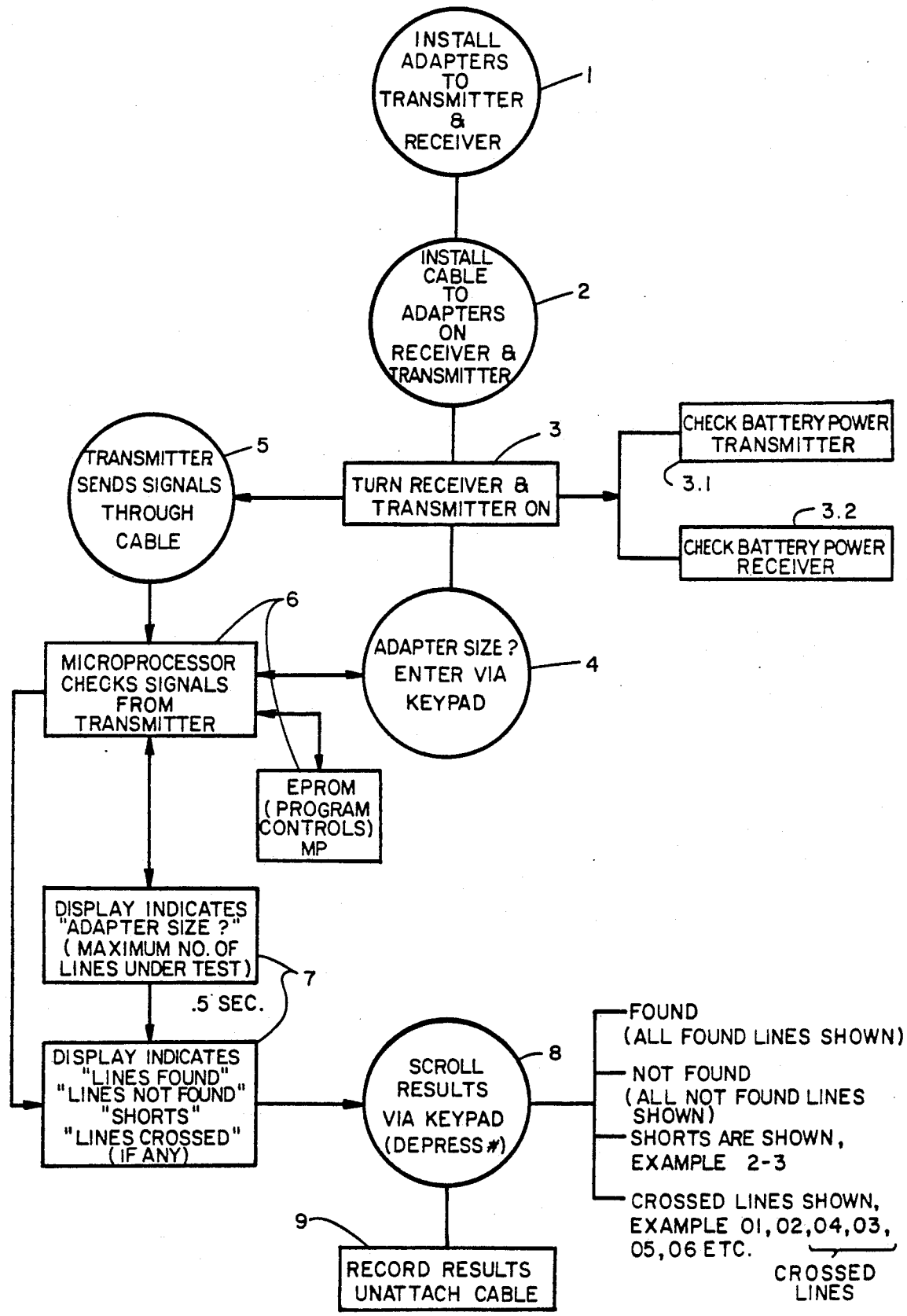
FIG. 5 is a flow chart showing a general sequence of operation of the cable tester.

A general cycle of operation for testing a multiconductor cable 12 by the cable tester 10 is shown schematically in FIG. 5. As indicated, a sequence of steps for testing a cable 12 may include:

Step (1) The adapters 18 and 20 are connected at opposite ends of the cable 12 to be tested.

Step (2) The adapters 18 and 20 are connected to the transmitter 14 and receiver 16, respectively.

Step (3) The transmitter 14 and the receiver 16 are turned on and power checks (3.1) (3.2) are performed separately by electrical circuits in the transmitter 14 and receiver 16, respectively.

Step (4) The number of conductors within the cable to be tested which corresponds to the adapter 18, 20 size is entered on the key pad 26 of the receiver 16. This data is stored by the microprocessor 22.

Step (5) The transmitter 14 sends signals through each separate conductor of the cable 12.

Step (6) The microprocessor 22 checks signals received by the receiver 16 from the transmitter 14 and processes data with programs stored in the EPROM memory 23.

Step (7) The display 24 initially indicates the adapter 18, 20 size or the number of conductors on the cable to be tested and after testing indicates:

"lines found",
"lines not found",
"shorts" and "lines crossed"

Step (8) Results can be scrolled via the key pad 26 of the receiver 16 onto the LCD display 24 of the receiver 16.

Step (9) Results can then be manually recorded on a separate medium and the cable 12 can be unattached from the cable tester 10 and adapter 18, 20.

Figure 3:
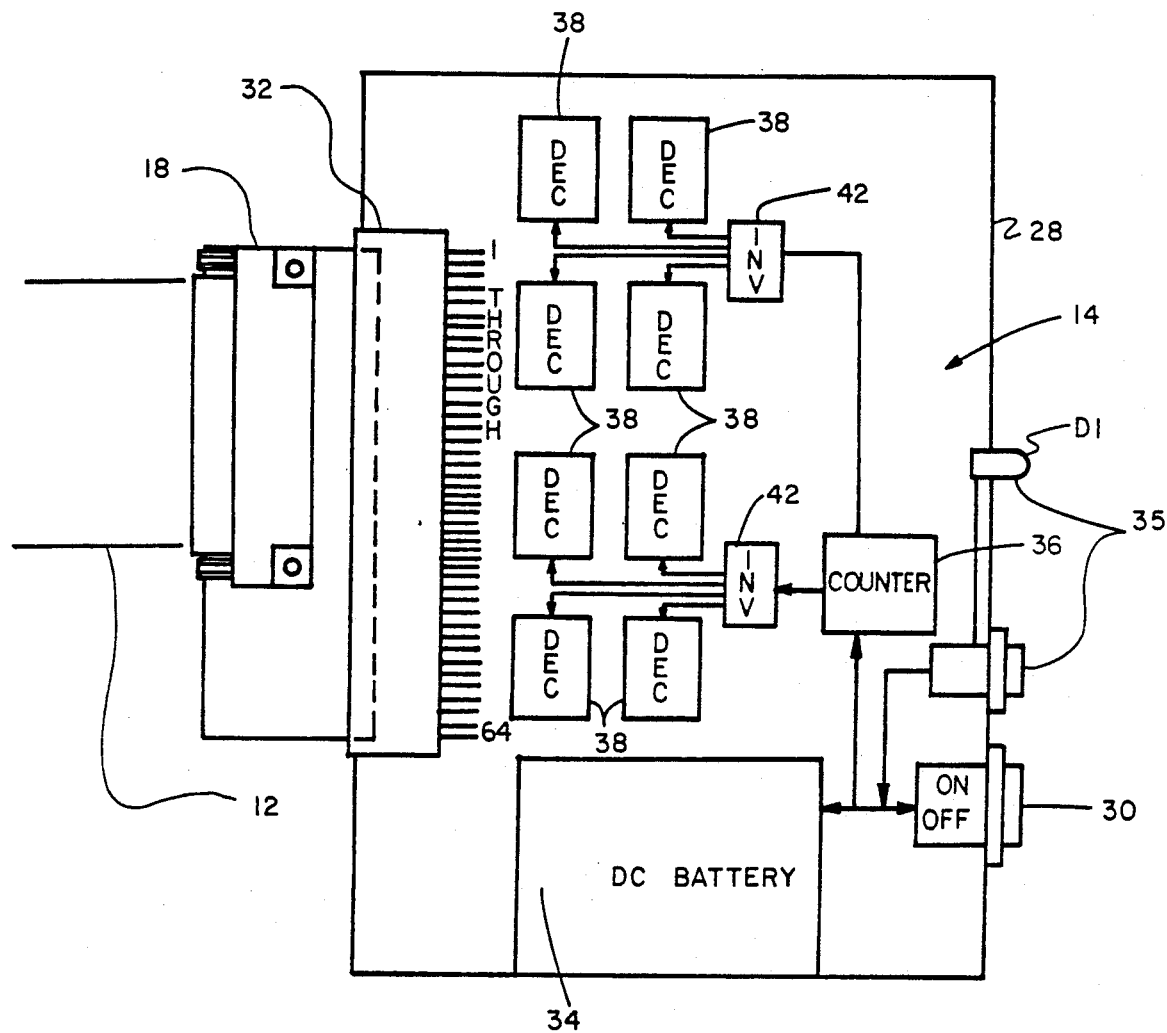
FIG. 3 is a schematic drawing of a transmitter component of the cable tester.

Referring now to FIG. 3, the transmitter 14 of the cable tester 10 is shown schematically. The electrical circuit means of the transmitter 14 is housed in a generally rectangular shaped case 28. An external on-off switch 30, and an external sixty four pin female card edge connector 32 are mounted to the case 28. The transmitter 14 includes a separate power source in the form of a D.C. battery 34 preferably nine volts. A charge indicator having an external low power LED indicator is connected to the battery 34 by suitable electric circuit 35 which is shown in FIG. 6.

Figure 6:
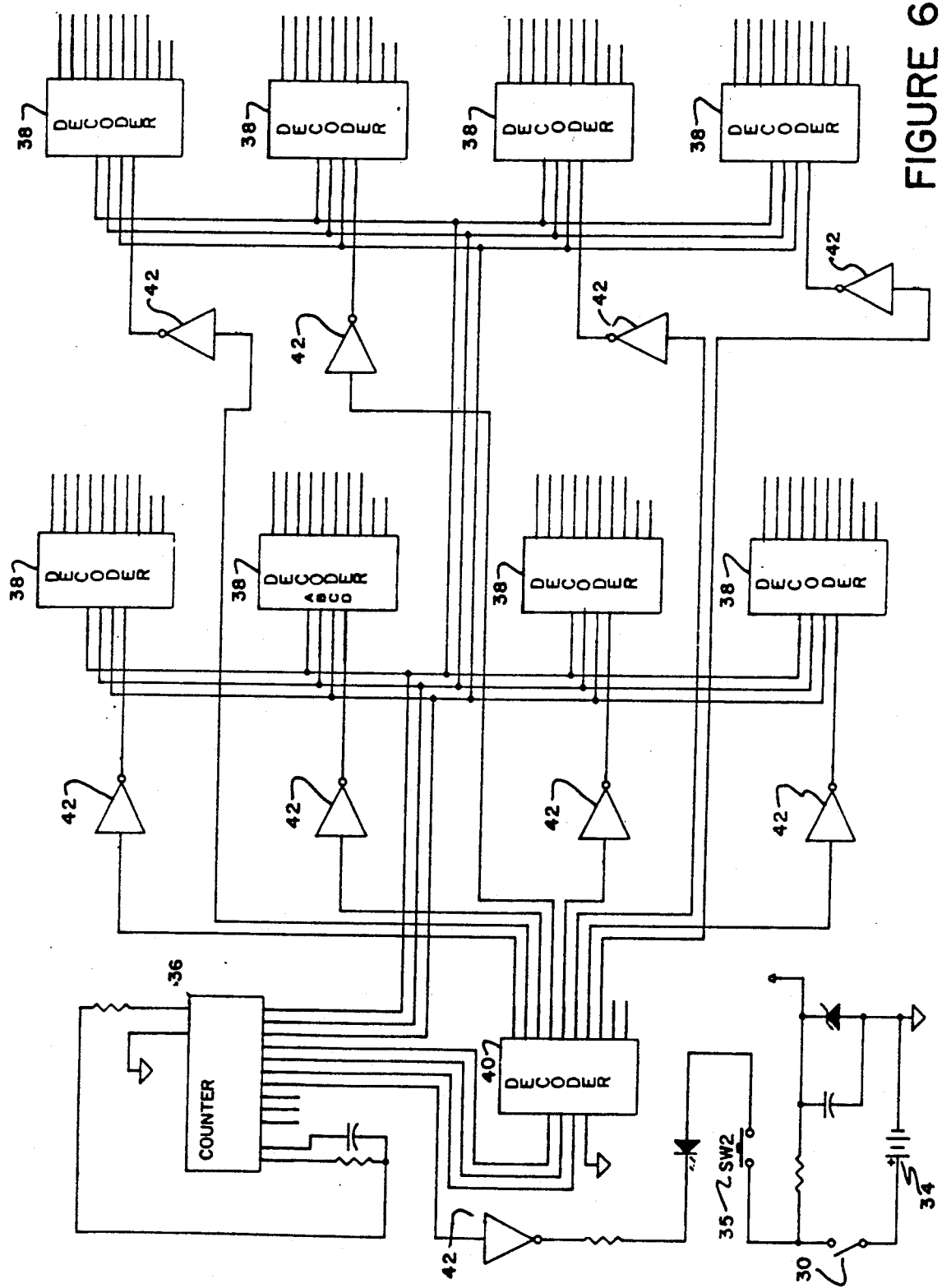
FIG. 6 is a partial schematic electrical diagram of a transmitter component of the cable tester.

Referring now to FIG. 6, the electrical circuit means of the transmitter 14 is shown in detail. The electrical circuit includes a counter 36 that generates voltage pulses sequentially through six address bits. The counter 36 contains an oscillation chip whose frequency rate is set by R1, R2 and C1. In the illustrative embodiment of the invention, an operating frequency is selected that allows all sixty-four outputs of the transmitter 14 to be pulsed in approximately 0.5 seconds. This allows time for the receiver 16 to scan all conductors of the cable 12 to insure no pulses are missed.

The lower three address bits of the counter 36 are connected to eight decoders 38. Each of the eight decoders 38 has eight outputs which terminate at the sixty four pin card edge connector 32 of the transmitter 14.

In addition to the counter 36 being connected to the eight decoders 38 by its lowest three address bits the next higher three address bits of the counter 36 are connected to a separate decoder 40 which in turn is connected to each of the eight decoders 38 via hex inverters 42. This allows each of the eight decoders 38 to be enabled one at a time. Hex inverters 42 between the counter 36 and each of the eight decoders 38 invert the signals into the decoders 38.

A total of sixty-four voltage pulses can thus be generated in sequence from the sixty-four outputs of the transmitter 14. As will hereinafter be more fully explained, since only one pulse is produced at a time, the remaining lines are held low and provide a return path for the voltage pulses through the receiver 16. A lesser number of voltage pulses may also be generated for testing a cable 12 having a lesser number of conductors. For a nine conductor cable for instance, all eight outputs of one of the eight decoders 38 along with a single output from another one of the eight decoders 38 can be utilized to generate nine sequential pulses.

Referring now to FIG. 4, the electrical circuit means of the receiver 16 is shown in detail. The receiver 16 is housed in a generally rectangular shaped case 43 and as previously stated includes the LCD display 24, the key pad 26, and the microprocessor 22 and EPROM memory 23. The receiver 16 includes a separate D.C. volt battery 44 which is preferably 9 volts for power. The receiver 16 may also include an DC power adapter 46. Additionally, the receiver 16 includes an external on/off switch 48. In addition as with the outputs of the transmitter 14 the corresponding inputs to the receiver initiate with a sixty-four pin female card edge connector 50.

Figure 7:
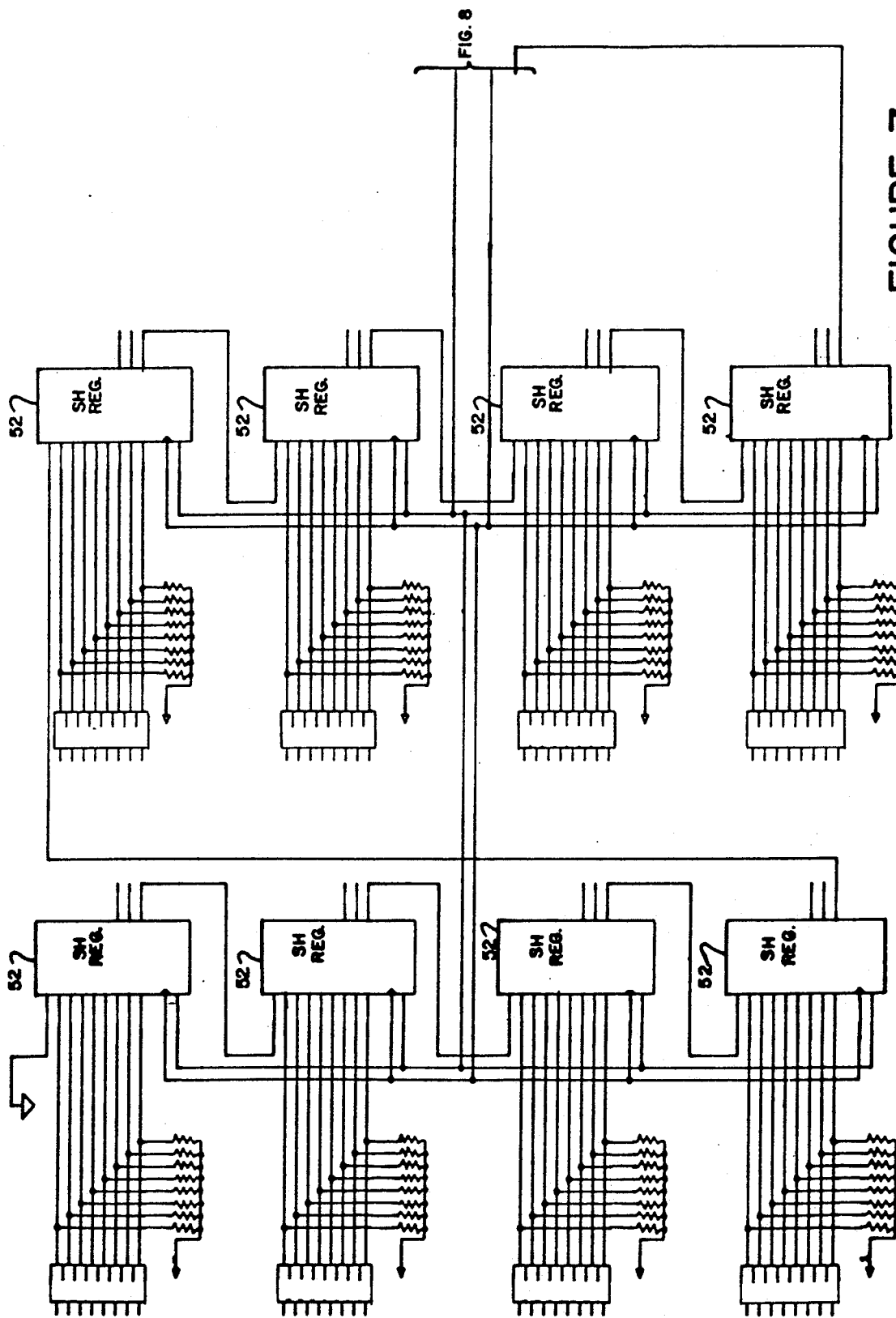
FIG. 7 is a partial schematic electrical diagram of the receiver component of the cable tester.

Referring now to FIG. 7, electrical circuit means of the receiver 16 is shown in schematic form. The electrical circuit of the receiver 16 has sixty-four inputs corresponding to the sixty-four outputs of the transmitter 14. Up to sixty-four inputs from the transmitter 14 can be entered into eight 8-bit shift registers 52 of the receiver electrical circuit. Each time the separate conductors of the cable 12 are checked, the microprocessor 22 causes the shift registers 52 of the receiver to parallel load all 64 test lines. The registers are then shifted so that each bit is read serially into the microprocessor 22. As shown, all the receiver inputs are connected to resistors (RP 1-8) which connect the receiver ground to the transmitter ground through the unused lines being held low.

The microprocessor 22 of the receiver 16 reads the input pulses from the transmitter 14, and sends appropriate commands to the LCD display 24. The microprocessor 22 also reads the key pad 26 entries for data input. The EPROM memory 23 stores the microcode or processing instructions for the microprocessor 22.

Figure 8:
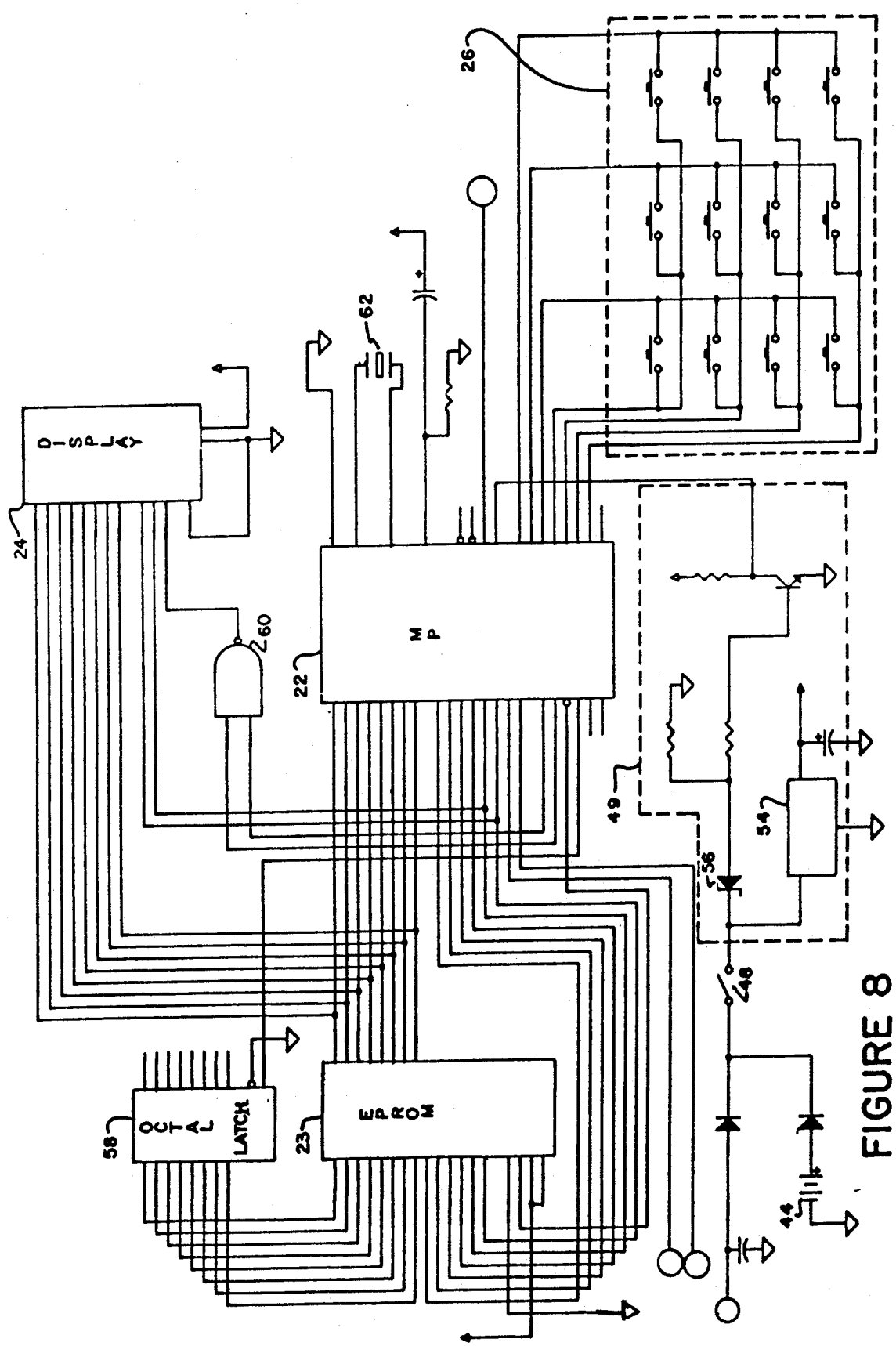
FIG. 8 is a schematic diagram of a receiver component of the cable tester.

Referring now to FIG. 8, further electrical circuit means or control circuit means for the receiver 12 is shown. The control circuit of the receiver terminates at the LCD display 24. The LCD display 24 is preferably a liquid crystal alpha numeric display having 16 characters and four lines. As shown commands and data are inputted through the DB0-DB7 lines of the LCD display 24. The micro processor 22 is programmed to clear the display, select the character position and to send the characters to be displayed. The microprocessor includes a 6.144 MHZ crystal 62.

As previously stated, the receiver power is supplied by either the battery 44 or by an external 500 ma DC power adapter 46. A voltage regulator 54 in the receiver electrical circuit uses this voltage to create a regulated 5 volts to operate the logic. A 5.1 volt zener diode 56 is used to detect when the 9 V input drops below 5.1 volts and creates a signal indicating low power that the microprocessor 22 reads and displays.

The microprocessor 22 sends the commands to the LCD display 24 upon receiving signals from the transmitter 14. Eight signals at a time from the shift registers 52 (FIG. 7) are read serially into the microprocessor 22. A binary to octal decoder or an octal latch 58 is located between the EPROM memory 23 and LCD display 24 to provide appropriate inputs for the LCD display 24. Gate 60 is also located between the microprocessor 22 and LCD display 24 to provide appropriate enablement for the LCD display 24.

The microprocessor 22 is activated upon inputting of the adapter size which corresponds to the number of conductors in the test cable 12. This input is entered through the key pad 26 into the microprocessor 22 which enables the shift registers 52 to read or accept signals.

Figure 2:
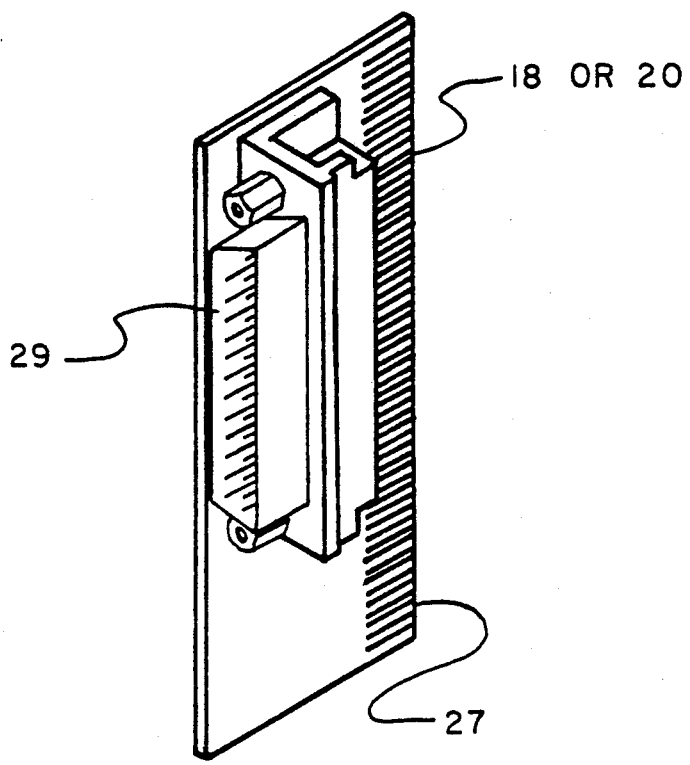
FIG. 2 is a perspective view of an adapter component of the cable tester.

Referring now to FIG. 2, a cable adapter 18 or 20 of the tester 10 is shown. The cable adapters 18 or 20 are constructed as male or female socket or pin connectors or the like adapted to physically connect the ends of the cable 12 and the individual conductors of the cable 12 to either the output of the transmitter 14 or the input of the receiver 16.

As shown in FIG. 2, the adapters 18 or 20 are formed with a sixty-four pin male card edge connector 27. In use of the tester 10 this connector 27 connects physically to the female sixty-four pin card edge connectors 32, 50 on the transmitter 14 or receiver 16. The adapters 18 or 20 are also formed with a socket type connector 29 which may be either male or female and which attaches to an end of the cable 12 to be tested. If for instance a cable having nine separate conductors is to be tested, connector 29 would be formed for coupling to these nine connectors. It is contemplated that different adapter sizes and configurations can be fabricated to connect various sizes of cable with the card edge connectors 32, 50 on the transmitter 12 and receiver 14 respectively.

By way of illustration only and not by limitation, there are listed below several types of cables upon which specific adapters can be constructed for connection to the cable 12 and to the connectors 32, 50 of the cable tester 10:

Description

RS-232 (9 pin)
RS-232 (15 pin)
RS-232 (25 pin)
RS-449 (37 pin)
UNIBUS
Q-BUS
Centronics (36 pin)
RJ11
RJ12
RJ13
Apple (24 pin)
HPIB, IEEE-448 (24 pin)
DSI (15 pin)
CCITT V35 (25 pin)
Custom Adapters (up to 64 pin)
Gender Changers The tester 10 may be used to test twisted-pair wire (dial up, four wire, voice grade telephone lines, unconditioned 4-wire lead lines) or ribbon cables (up to 64 conductors) when used with the appropriate adapters 18, 20. The cable tester 10 has been used to successfully test cable up to approximately 2400 feet in length.

Referring to FIG. 4, the key pad 26 is shown. The key pad 26 allows the operator to enter the adapter size (which may be in the format of a two digit number), and to access all test data and the LCD display 24. By pushing the "*" button, information on the LCD display 24 will scroll down. The "#" button controls the scrolling of information up on the LCD display. When a return to home position is desired, the "O" button initiates this function.

During operation of the cable tester 10 continuity of a conductor on the cable 12 is detected when a pulse generated by the transmitter 14 is detected on a corresponding conductor in the receiver 16. Opens exist when a transmitter pulse does not get detected by the receiver 16. Shorts between conductors in the cable 12 are detected when two wires indicate a voltage pulse at the same time.

Figure 9:
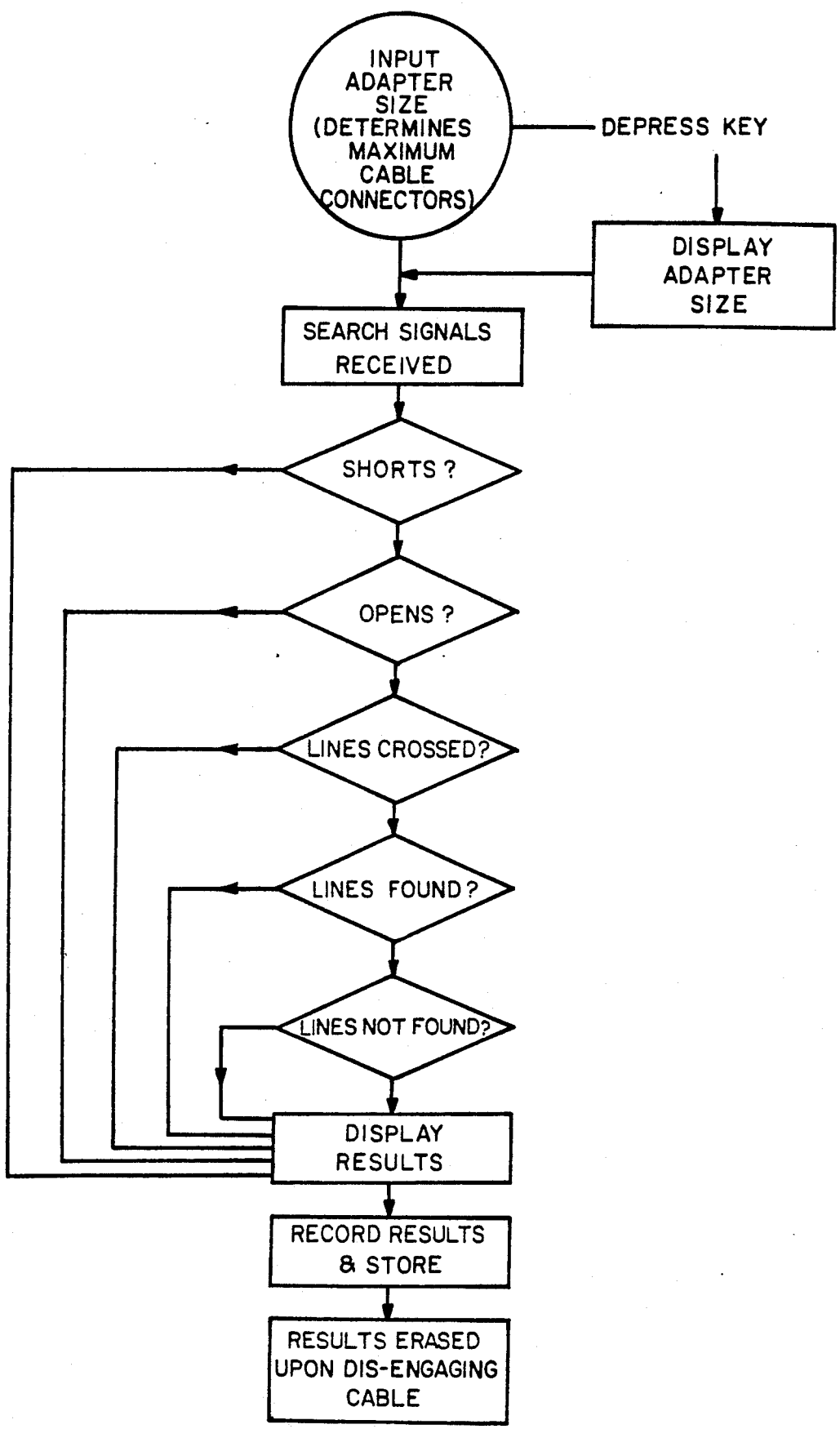
FIG. 9 is a flow chart of the program for providing the processing instructions for a microprocessor component of the cable tester.
Figure 10:
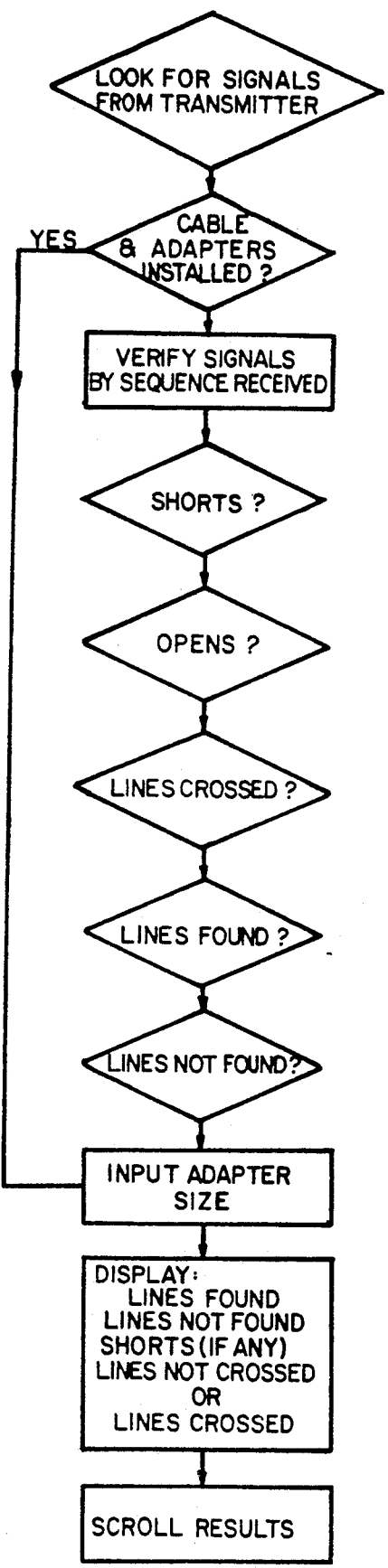
FIG. 10 is a further flow chart of the program for providing the processing instructions for the microprocessor component of the cable tester.

Referring now to FIGS. 9 and 10, flow charts of the program logic for the microcodes stored in the EPROM memory 23 are shown. As shown the first entry involves the adapter size which indicates or corresponds to the number of conductors on the cable to be tested. This data is initially displayed on the LCD display 24. Upon reception of signals by the receiver 16 from the transmitter 14, the program has routines to identify and display:

Lines found
Lines not found (meaning open)
Lines shorted
Lines crossed or not crossed The key for execution of the programs is the adapter size input.

The microprocessor 22 can be programmed to control the LCD display 24 to display the following information:

|       | Total Found     | 00 |
|-------|-----------------|----|
|       | Total NOT Fnd   | 00 |
|       | No Lines crossed |   |

When the testing of the cable 12 is complete, the LCD display 24 will display the following information:

|       | Total Found   | xx                        |
|-------|---------------|---------------------------|
|       | Total NOT Fnd | yy                        |
|       | Shorts Fnd    | (list of shorts, if any)  |
|       | Lines Crossed | (check sequence, see example below) |

The letters "xx" and "yy" will be an actual number of conductors that the tester 10 found or did not find and any shorts found. To view the list of conductors "FOUND" and tested successfully, the "#" key must be depressed on the receiver key pad. The list of conductor numbers providing continuity will follow on the next several lines. To continue scrolling through these values, the "#" must be continually depressed. To locate crossed lines, sequence is noted to identify which lines are crossed. (FOR EXAMPLE: Found—1, 2, 3, 5, 4, 6, 7, 8, 9—on a 9 pin cable, lines 4 and 5 are crossed.) After a blank line is displayed, the words "NOT FOUND" will appear. A list of conductor numbers not found will follow on the next lines.

A blank line will indicate that the next section of information, "SHORTS FOUND" will appear. A list of conductors that were determined to be shorted will be displayed with a hyphen between the conductor numbers which were shorted together.

The fourth line will identify either "NO LINES CROSSED" or "LINES CROSSED". The crossed lines will be identified while scrolling the "FOUND" conductor lines. To review this information, the "*" button is depressed to scroll up. To return to home position, the "O" button is depressed.

By way of illustration only and not by limitation, there are listed below devices that have been found suitable for use in the illustrated electric circuits.

| Reference No. | Description          | Part No.           |
|---------------|----------------------|--------------------|
| 22            | microprocessor       | 80 C 31            |
| 23            | EPROM memory crystal | 27 C 64 6.144 M    |
| 24            | LCD display alphanumeric | 16 × 4 lines   |
| 26            | key pad              | 3 × 4 matrix       |
| 32, 50        | card edge connector  | Molex 71003-4131   |
| 36            | counter              | CD 4060B           |
| 38            | BCD decoder          | CD 4028B           |
| 42            | hex inverter         | CD 4049B           |
| 52            | shift registers      | CD 4021 B          |
| 54            | voltage regulator    | 7805               |
| 58            | octal latch          | 74 HC 373          |
| 56            | zener diode          | IN4735 6.2 B, 1W   |

Thus, the cable tester of the invention provides for the testing of a multiconductor cable by a single operator Additionally, it is not necessary to bring the cable ends to a single location. Moreover the test is completed within seconds with the data presented in an understandable format. A separate conductor path for the test is not required. Although the present invention has been described with a certain degree of particularity, it is understood that the present disclosure has been made by way of example and that changes in details of structure may be made without departing from the spirit thereof.

I claim:

1. A portable cable tester apparatus for testing a multiconductor cable comprising:

transmitter means for connection to a first end of the cable for connecting with each separate conductor of the cable and including a power source and electrical circuit means for generating a signal in sequence through each separate conductor of the cable;

receiver means for connection to a second end of the cable for connecting with each separate conductor of the cable and including a separate power source and electrical circuit means for receiving and decoding the signals received from said transmitter means through the separate conductors of the cable;

adapter means for connecting the first and second ends of the cable and each separate conductor of the cable to said transmitter means and said receiver means respectively;

microprocessing means having a microcode program for inputting and interpreting data from said receiver means and for control of output commands to a display means;

keyboard means for inputting data into and accessing said microprocessing means; and display means for displaying data from said microprocessing means;

whereby each conductor of the cable can be tested for continuity, shorts, or crosses; and with the electrical circuit means of said transmitter means and the electrical circuit means of said receiver means providing a return path for the signals generated by said transmitter means.

2. Apparatus as claimed in claim 1 and wherein said receiver means comprises:

a case;

an LCD display mounted on said case;

a microprocessor having a programmed EPROM memory;

a key pad mounted on said case for inputting data into said microprocessor;

said LCD display, said microprocessor and said key pad connected in an electrical circuit wherein electrical signals are received from said transmitter and processed through said microprocessor to control a readout of said LCD display.

3. Apparatus as claimed in claim 2 and wherein:

said transmitter means includes sixty-four outputs for testing cables having up to sixty-four separate conductors and said receiver means includes sixty-four inputs for receiving up to sixty-four signals from said receiver means.

4. Apparatus as claimed in claim 1 and wherein:

said adapter means includes a card edge connector for connection to either said transmitter means or said receiver means and a socket pin connector for connection to either end of the multiconductor cable.

5. Apparatus as claimed in claim 4 and wherein:

said transmitter means sends an electrical signal through each output in approximately 0.5 seconds.

6. Apparatus as claimed in claim 1 and wherein:

said transmitter means and said receiver means each include low power indicators.

7. A portable self-contained cable tester apparatus for testing a cable having a plurality of separate conductors comprising:
  a transmitter having a power source and including an electrical circuit for generating an electrical signal in sequence through a plurality of outputs;
  first adapter means for connecting each separate conductor of the cable to an output of said transmitter at a first end of the cable;
  a receiver having a separate power source and including an electrical circuit with a plurality of inputs corresponding to the outputs of said transmitter for receiving signals through the separate conductors of the cable from said transmitter and for providing a return path for the signals;
  an LCD display in the electrical circuit of said receiver;
  a programmed microprocessor in the electrical circuit of said receiver for processing the signals from said transmitter to control said LCD display;
  a key pad in the electrical circuit of said receiver for inputting data into said microprocessor and for accessing said microprocessor;
  second adapter means for connecting each separate conductor of the cable to an input of said receiver at a second end of the cable whereby;
  continuity can be detected when a signal generated by said transmitter is detected on a corresponding input of said receiver;
  opens can be detected when a signal generated by said transmitter is not detected on a corresponding input of said receiver; and
  crosses can be detected when separate inputs of said receiver indicate a signal at the same time.

8. Apparatus as claimed in claim 7 and wherein:
said microprocessor, said LCD display and said key pad are mounted in a single case.

9. Apparatus as claimed in claim 8 and wherein:
said transmitter generates signals through each output in approximately 0.5 seconds.

10. Apparatus as claimed in claim 11 and wherein:
said inputs to said receiver and said outputs from said transmitter are connected to female card edge connectors.

11. Apparatus as claimed in claim 10 and wherein:
said first and said second adapter means include a male card edge connector for connection to said female connectors and a connector for connecting to an end of the cable.

12. Apparatus as claimed in claim 8 and wherein:
the power source of said transmitter comprises a D.C. battery.

13. Apparatus as claimed in claim 12 and wherein:
the separate power source of said receiver comprises a D.C. battery or a DC power adapter.

14. Apparatus as claimed in claim 13 and wherein:
said transmitter and said receiver include low battery detectors.

15. A portable self contained cable tester for testing a cable having a plurality of separate conductors comprising:
  a transmitter having a power source and mounted in a case and including an electrical circuit with a counter for sequentially generating voltage pulses through a plurality of outputs;
  first adapter means for connecting each separate conductor of the cable to an output of said transmitter at a first end of the cable;
  a receiver having a separate power source and including an electrical circuit with a voltage regulator for operating components in the electrical circuit at a regulated voltage with each of the inputs of said receiver connected to resistors which connect a receiver ground to a transmitter ground;
  a programmed microprocessor connected to the electrical circuit of said receiver for receiving signals severally through a plurality of shift registers in the electrical circuit of said receiver from said transmitter;
  an LCD display controlled by said microprocessor,
  a key pad for inputting data into said microprocessor and for accessing said microprocessor;
  second adapter means for connecting each separate conductor of the cable to an input of said receiver at a second end of the cable;
  whereby continuity can be detected when a voltage pulse generated by said transmitter is not detected on a corresponding input of said receiver; and
  crosses can be detected when separate inputs of said receiver indicate a voltage at the same time.

16. A cable tester as claimed in claim 15 and wherein:
said LCD display is alpha numeric having a plurality of lines that may be scrolled by input from said key pad.

17. A cable tester as claimed in claim 15 and wherein:
said transmitter includes sixty-four outputs and said receiver includes sixty-four inputs.

18. A cable tester as claimed in claim 15 and wherein:
said microprocessor includes routines for determining shorts, opens, lines crosses, lines found, lines not found.

19. A cable tester as claimed in claim 15 and wherein:
said microprocessor is programmed to control the LCD display to display total found, total not found, shorts found, lines crossed or no lines crossed.

20. A cable tester as claimed in claim 15 and wherein:
said microprocessor is programmed by an EPROM memory.

* * * * *